US012699204B2

(12) United States Patent
Luo

(10) Patent No.: US 12,699,204 B2
(45) Date of Patent: Aug. 4, 2026

(54) METHOD AND SYSTEM FOR CALCULATING CARBON AND WATER FLUX OF ECOSYSTEM BASED ON WEATHER STATION

(71) Applicant: Xinjiang Institute of Ecology and Geography, CAS, Urumqi City (CN)

(72) Inventor: Geping Luo, Urumqi City (CN)

(73) Assignee: Xinjiang Institute of Ecology and Geography, CAS (CN)

( * ) Notice: Subject to any disclaimer, the term of this patent is extended or adjusted under 35 U.S.C. 154(b) by 441 days.

(21) Appl. No.: 18/209,829

(22) Filed: Jun. 14, 2023

(65) Prior Publication Data

US 2024/0241287 A1 Jul. 18, 2024

(30) Foreign Application Priority Data

Jan. 16, 2023 (CN) .......................... 202310097077.4

(51) Int. Cl.
*G01W 1/10* (2006.01)
*G01W 1/04* (2006.01)
*G06F 30/20* (2020.01)
*G06N 20/00* (2019.01)

(52) U.S. Cl.
CPC ................ *G01W 1/10* (2013.01); *G01W 1/04* (2013.01); *G06N 20/00* (2019.01); *G06F 30/20* (2020.01); *Y02A 90/10* (2018.01)

(58) Field of Classification Search
CPC .......... G01W 1/10; G01W 1/04; G06N 20/00; Y02A 90/10; G06F 30/20
See application file for complete search history.

(56) References Cited

U.S. PATENT DOCUMENTS

2014/0081579 A1* 3/2014 Tyburski ............ G01N 33/0004
702/19

FOREIGN PATENT DOCUMENTS

CN 111080173 A * 4/2020 .............. G06Q 50/26
CN 116050163 A * 5/2023 .............. G01W 1/10

OTHER PUBLICATIONS

Hu et al. (Modeling the Carbon Cycle of a Subtropical Chinese Fir Plantation Using a Multi-Source Data Fusion Approach. Forests 2020,11, 369. Mar. 26, 2020, https://doi.org/10.3390/f11040369) (Year: 2020).*

(Continued)

*Primary Examiner* — Christian T Bryant
(74) *Attorney, Agent, or Firm* — Billion & Armitage

(57) ABSTRACT

The present disclosure discloses a method and system for calculating a carbon and water flux of an ecosystem based on a weather station, and relates to the technical field of calculation of carbon and water fluxes of ecosystems. According to a plant function type (PFT) and/or a climate type, eddy covariance flux stations are selectively combined to obtain a plurality of combinations characterizing different scenarios of an ecosystem and a plurality of carbon and water flux data sets respectively corresponding to the plurality of combinations, a plurality of carbon and water flux models and an evaluation model for predicting a determination coefficient are further constructed, and the evaluation model is used to determine a carbon and water flux model suitable for each weather station in a target area, such as to calculate a carbon and water flux based on observation data of the weather station.

11 Claims, 5 Drawing Sheets

(56) References Cited

OTHER PUBLICATIONS

Kang et al. ("Modelling the responses of carbon and water fluxes with climate change for a poplar plantation in northern China based on the Biome-BGC model." Acta Ecologica Sinica 39.7 (2019): 2378-2390) (Year: 2019).*

Wang et al. (Net carbon flux from cropland changes in the Central Asian Aral Sea Basin. J Environ Manage. Jul. 15, 2022;314: 115078. doi: 10.1016/j.jenvman.2022.115078. Epub Apr. 18, 2022. PMID: 35447452) (Year: 2022).*

* cited by examiner

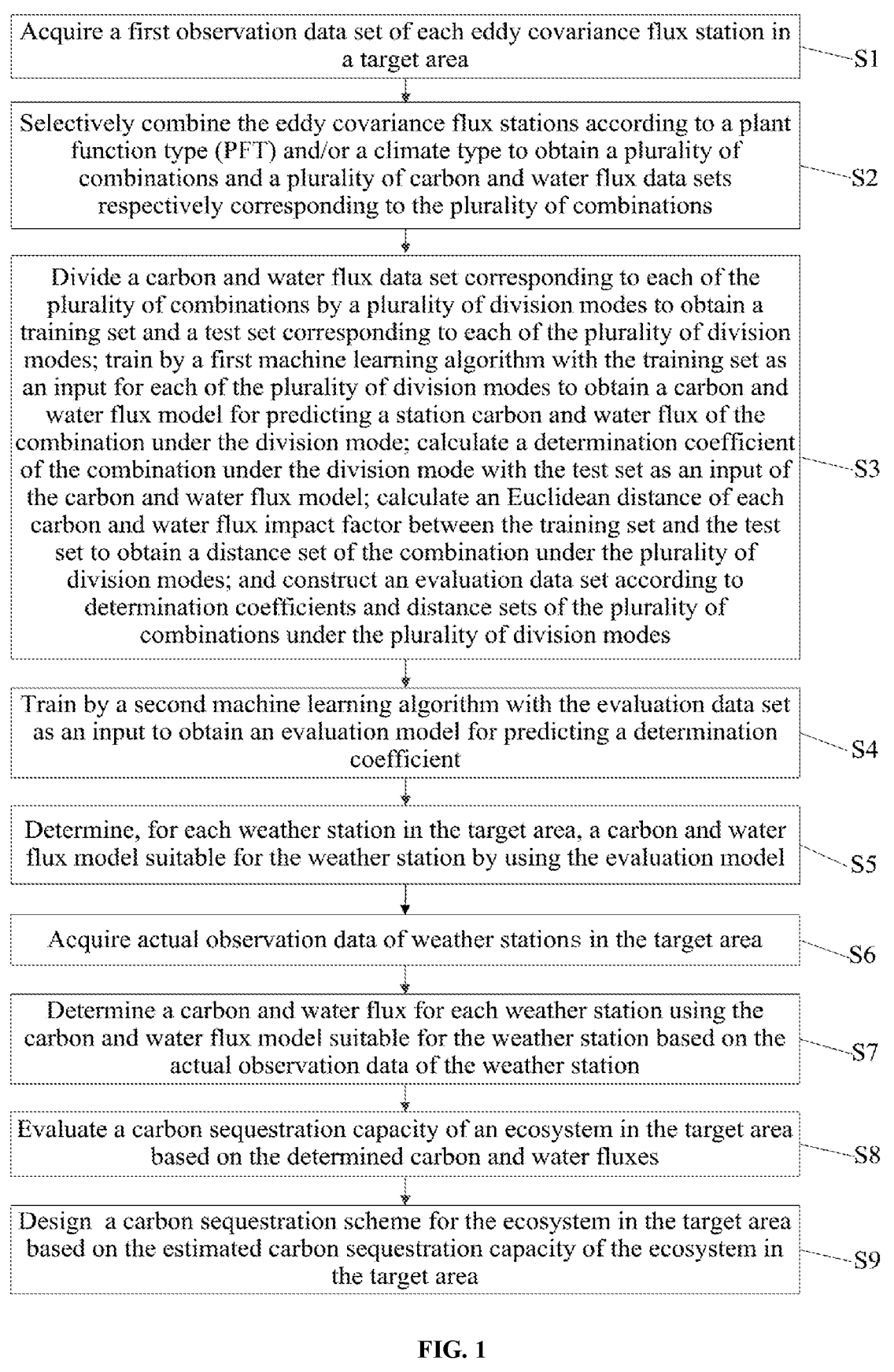

Acquire a first observation data set of each eddy covariance flux station in a target area ⌐∼S1

Selectively combine the eddy covariance flux stations according to a plant function type (PFT) and/or a climate type to obtain a plurality of combinations and a plurality of carbon and water flux data sets respectively corresponding to the plurality of combinations ⌐∼S2

Divide a carbon and water flux data set corresponding to each of the plurality of combinations by a plurality of division modes to obtain a training set and a test set corresponding to each of the plurality of division modes; train by a first machine learning algorithm with the training set as an input for each of the plurality of division modes to obtain a carbon and water flux model for predicting a station carbon and water flux of the combination under the division mode; calculate a determination coefficient of the combination under the division mode with the test set as an input of the carbon and water flux model; calculate an Euclidean distance of each carbon and water flux impact factor between the training set and the test set to obtain a distance set of the combination under the plurality of division modes; and construct an evaluation data set according to determination coefficients and distance sets of the plurality of combinations under the plurality of division modes ⌐∼S3

Train by a second machine learning algorithm with the evaluation data set as an input to obtain an evaluation model for predicting a determination coefficient ⌐∼S4

Determine, for each weather station in the target area, a carbon and water flux model suitable for the weather station by using the evaluation model ⌐∼S5

Acquire actual observation data of weather stations in the target area ⌐∼S6

Determine a carbon and water flux for each weather station using the carbon and water flux model suitable for the weather station based on the actual observation data of the weather station ⌐∼S7

Evaluate a carbon sequestration capacity of an ecosystem in the target area based on the determined carbon and water fluxes ⌐∼S8

Design a carbon sequestration scheme for the ecosystem in the target area based on the estimated carbon sequestration capacity of the ecosystem in the target area ⌐∼S9

FIG. 1

METHOD AND SYSTEM FOR CALCULATING CARBON AND WATER FLUX OF ECOSYSTEM BASED ON WEATHER STATION

CROSS REFERENCE TO RELATED APPLICATION

This patent application claims the benefit and priority of Chinese Patent Application No. 2023100970774, filed with the China National Intellectual Property Administration on Jan. 16, 2023, the disclosure of which is incorporated by reference herein in its entirety as part of the present application.

TECHNICAL FIELD

The present disclosure relates to the technical field of calculation of carbon and water fluxes of ecosystems, and in particular relates to a method and system for calculating a carbon and water flux of an ecosystem based on a weather station.

BACKGROUND

The productivity of terrestrial ecosystems and the spatial and temporal distribution of carbon sources and sinks in terrestrial ecosystems are still not well understood, which is attributed to the following two factors: 1. There is an acute shortage of ecosystem carbon observation data and the support for carbon monitoring is insufficient. Eddy covariance flux stations are mainstream channels for acquiring carbon flux observation data of an ecosystem. However, due to high costs of construction, observation, management, and data processing of flux stations, there are only 721 flux stations worldwide at present, and these flux stations are distributed very unevenly. Therefore, complicated diverse ecosystems cannot be fully and effectively covered, there is an acute shortage of carbon observation data, the needs of carbon monitoring and carbon accounting of ecosystems cannot be met, and a driving mechanism of carbon dynamics of an ecosystem cannot be fully understood, which has become one of the main bottlenecks restricting the research on carbon cycling of terrestrial ecosystems worldwide. 2. The traditional carbon accounting techniques and methods for ecosystems face many limitations and challenges. A biogeochemical model/ecosystem model, an atmospheric carbon dioxide inversion model, a land surface process (LSP) model, and an empirical statistical model may be currently used alone or in combination as a mainstream method for carbon accounting and evaluation, and these models are basically based on the integration and coupling of known mechanism processes or empirical cognition, give insufficient consideration or simplified processing to mechanisms and processes that are under study or immature, and lack sufficient carbon observation data to support verification. Input data of these models are mostly spatial grid data with high uncertainty, e.g., reanalysis data with a spatial resolution of 25 to 100 km, which leads to high uncertainty in carbon estimation results and cannot meet the requirements of carbon accounting accuracy for ecosystems.

Compared with the very rare eddy covariance flux stations, weather stations are more abundant and more widely distributed. There are nearly 30,000 public weather stations worldwide, which is more than 40 times that of the eddy covariance flux stations. However, the potential of weather stations in carbon monitoring for ecosystems has not yet been tapped. In view of this, it is urgent to develop a technique for calculating a carbon and water flux of an ecosystem based on a weather station.

SUMMARY

An objective of the present disclosure is to provide a method and system for calculating a carbon and water flux of an ecosystem based on a weather station. In the present disclosure, observation data of the weather stations can be used to calculate the carbon and water flux, which improves a data volume of the carbon and water flux and the calculation accuracy.

To achieve the above objective, the present disclosure provides the following technical solutions:

A method for calculating a carbon and water flux of an ecosystem based on a weather station is provided, including:

acquiring a first observation data set of each eddy covariance flux station in a target area, where the first observation data set includes carbon and water flux observation data and weather observation data of the eddy covariance flux station and vegetation, soil and topography data of a location of the eddy covariance flux station; or the first observation data set includes the carbon and water flux observation data and the weather observation data of the eddy covariance flux station and the vegetation, soil and topography data and remote sensing data of the location of the eddy covariance station;

selectively combining the eddy covariance flux stations according to a plant function type (PFT) and/or a climate type to obtain a plurality of combinations and a plurality of carbon and water flux data sets respectively corresponding to the plurality of combinations, where the plurality of combinations each include a plurality of training sets and a plurality of test sets and characterize a scenario of a landscape or an ecosystem; and the carbon and water flux data sets each include first observation data sets of all eddy covariance flux stations within a corresponding combination;

dividing a carbon and water flux data set corresponding to each of the plurality of combinations by a plurality of division modes to obtain a training set and a test set corresponding to each of the plurality of division modes; training by a first machine learning algorithm with the training set as an input for each of the plurality of division modes to obtain a carbon and water flux model for predicting a station carbon and water flux of the combination under the division mode; calculating a determination coefficient of the combination under the division mode with the test set as an input of the carbon and water flux model; calculating an Euclidean distance of each carbon and water flux impact factor between the training set and the test set to obtain a distance set of the combination under the plurality of division modes; and constructing an evaluation data set according to determination coefficients and Euclidean distance sets of the plurality of combinations under the plurality of division modes, where the carbon and water flux impact factor refers to data in the first observation data set other than the carbon and water flux observation data;

training by a second machine learning algorithm with the evaluation data set as an input to obtain an evaluation model for predicting a determination coefficient;

determining, for each weather station in the target area, a carbon and water flux model suitable for the weather station by using the evaluation model;

acquiring actual observation data of weather stations in the target area;

determining a carbon and water flux for each weather station using the carbon and water flux model suitable for the weather station based on the actual observation data of the weather station evaluating a carbon sequestration capacity of an ecosystem in the target area based on the determined carbon and water fluxes; and designing a carbon sequestration scheme for the ecosystem in the target area based on the estimated carbon sequestration capacity of the ecosystem in the target area.

In some embodiments, the weather observation data include an air temperature, a precipitation, a saturated vapor pressure deficit (VPD), an air pressure, a downward shortwave radiation (DSWR), an atmospheric relative humidity, a wind speed, a wind direction, and a sunshine duration; the vegetation, soil and topography data include a soil texture, a land cover type, and a location topography; and the remote sensing data include a vegetation index, a band spectrum, a surface water index, a land surface temperature (LST), and a land surface humidity.

In some embodiments, the PFT includes a cropland (CRO), a grassland (GRA), a deciduous broadleaf forest (DBF), an evergreen broadleaf forest (EBF), an evergreen needleleaf forest (ENF), a mixed forest (MF), a savannah (SAV), a shrubland (SHR), a wetland (WET), and a desert; and the climate type includes an arid climate, a semi-arid climate, a semi-humid climate, and a humid climate.

In some embodiments, a construction method of the carbon and water flux data set includes: randomly sampling for first observation data sets of all eddy covariance flux stations in the combination according to a predetermined time scale to obtain the carbon and water flux data set, where predetermined time scales of different carbon and water flux data sets are different or the same.

In some embodiments, when the carbon and water flux observation data include carbon flux observation data and water flux observation data and the carbon and water flux model includes a carbon flux model for predicting a station's carbon flux and a water flux model for predicting a station water flux, the training by a first machine learning algorithm with the training set as an input to obtain a carbon and water flux model for predicting a station carbon and water flux of the combination under the division mode specifically includes:

with data in the training set other than the carbon and water flux observation data as an input and the carbon flux observation data in the training set as a label, training by the first machine learning algorithm to obtain the carbon flux model for predicting a station's carbon flux of the combination under the division mode; and with data in the training set other than the carbon and water flux observation data as an input and the water flux observation data in the training set as a label, training by the first machine learning algorithm to obtain the water flux model for predicting a station water flux of the combination under the division mode.

In some embodiments, when the carbon flux model is trained, the weather observation data include an air temperature, a precipitation, a saturated VPD, and a DSWR, the vegetation, soil and topography data include a soil texture and a location topography, and the remote sensing data include a vegetation index; and when the water flux model is trained, the weather observation data include an air temperature, a precipitation, a saturated VPD, a DSWR, and a wind speed, the vegetation, soil and topography data include a soil texture and a location topography, and the remote sensing data include a vegetation index and a surface water index.

In some embodiments, the using the evaluation model to determine a carbon and water flux model suitable for the weather station specifically includes:

acquiring a second observation data set of the weather station, where data of the second observation data set are of the same type as data in the first observation data set other than the carbon and water flux observation data;

for the carbon and water flux model, calculating an Euclidean distance of each carbon and water flux impact factor between a training set used for training the carbon and water flux model and the second observation data set to obtain an application distance set; and with the application distance set as an input, using the evaluation model to calculate an application determination coefficient for applying the carbon and water flux model to the weather station, where the application determination coefficient corresponds to the carbon and water flux model; and determining the carbon and water flux model suitable for the weather station according to application determination coefficients corresponding to all carbon and water flux models.

In some embodiments, the determining the carbon and water flux model suitable for the weather station according to application determination coefficients corresponding to all carbon and water flux models specifically includes:

for each carbon and water flux model, determining whether an application determination coefficient corresponding to the carbon and water flux model is greater than or equal to a preset threshold, where if the application determination coefficient corresponding to the carbon and water flux model is greater than or equal to the preset threshold, the carbon and water flux model is suitable for the weather station; if the application determination coefficient corresponding to the carbon and water flux model is less than the preset threshold, the carbon and water flux model is not suitable for the weather station; and all carbon and water flux models suitable for the weather station constitute a candidate set; and selecting a carbon and water flux model with a largest application determination coefficient in the candidate set as the carbon and water flux model suitable for the weather station.

In some embodiments, the preset threshold is greater than or equal to 0.5.

A system for calculating a carbon and water flux of an ecosystem based on a weather station is provided, including:

a data acquisition module configured to acquire a first observation data set of each eddy covariance flux station in a target area, where the first observation data set includes carbon and water flux observation data and weather observation data of the eddy covariance flux station and vegetation, soil and topography data of a location of the eddy covariance flux station; or the first observation data set includes the carbon and water flux observation data and the weather observation data of the eddy covariance flux station and the vegetation, soil and topography data and remote sensing data of the location of the eddy covariance flux station;

a carbon and water flux data set construction module configured to selectively combine the eddy covariance flux stations according to a PFT and/or a climate type to obtain a plurality of combinations and a plurality of carbon and water flux data sets respectively corresponding to the plurality of combinations, where the plurality of combinations each include a plurality of training sets and a plurality of test sets and characterize a scenario of a landscape or an ecosystem; and the carbon and water flux data sets each include first observation data sets of all eddy covariance flux stations within a corresponding combination;

an evaluation data set construction module configured to divide a carbon and water flux data set corresponding to each of the plurality of combinations by a plurality of division modes to obtain a training set and a test set corresponding to each of the plurality of division modes; train by a first machine learning algorithm with the training set as an input for each of the plurality of division modes to obtain a carbon and water flux model for predicting station carbon and water flux of the combination under the division mode; calculate a determination coefficient of the combination under the division mode with the test set as an input of the carbon and water flux model; calculate an Euclidean distance of each carbon and water flux impact factor between the training set and the test set to obtain a distance set of the combination under the plurality of division modes; and construct an evaluation data set according to determination coefficients and Euclidean distance sets of the plurality of combinations under the plurality of division modes, where the carbon and water flux impact factor refers to data in the first observation data set other than the carbon and water flux observation data;

an evaluation model construction module configured to train by a second machine learning algorithm with the evaluation data set as an input to obtain an evaluation model for predicting a determination coefficient; and a calculation module configured to determine, for each weather station in the target area, a carbon and water flux model suitable for the weather station by using the evaluation model;

an actual observation data acquisition module configured to acquire actual observation data of weather stations in the target area; and a determining module configured to determine a carbon and water flux for each weather station using the carbon and water flux model suitable for the weather station based on the actual observation data of the weather station, to evaluate a carbon sequestration capacity of an ecosystem in the target area and design a carbon sequestration scheme for the ecosystem in the target area.

According to specific embodiments provided by the present disclosure, the present disclosure discloses the following technical effects:

The present disclosure discloses a method and system for calculating a carbon and water flux of an ecosystem based on a weather station. According to a PFT and/or a climate type, eddy covariance flux stations are selectively combined to obtain a plurality of combinations characterizing different scenarios of an ecosystem and a plurality of carbon and water flux data sets respectively corresponding to the plurality of combinations, a plurality of carbon and water flux models and an evaluation model for predicting a determination coefficient are further constructed, the evaluation model is used to determine a carbon and water flux model suitable for each weather station in a target area, and the carbon and water flux model suitable for the weather station is used to a calculate carbon and water flux, such as to calculate a carbon and water flux based on observation data of the weather station. Compared with the method of acquiring a carbon and water flux based on eddy covariance flux stations, the method of the present disclosure can mine high-accuracy carbon and water flux information of all weather stations in a target area, leads to an amount of carbon and water flux data that is significantly increased, exhibits high calculation accuracy, and can meet the requirements of data volume and accuracy of carbon monitoring and carbon accounting for an ecosystem, which can provide a technical support for evaluation of peak carbon dioxide emissions and carbon neutrality.

BRIEF DESCRIPTION OF THE DRAWINGS

To describe the technical solutions in the embodiments of the present disclosure or in the prior art more clearly, the accompanying drawings required for the embodiments are briefly described below. Apparently, the accompanying drawings in the following description show merely some embodiments of the present disclosure, and those of ordinary skill in the art may still derive other accompanying drawings from these accompanying drawings without creative efforts.

FIG. 1 is a flow chart of the method provided in Embodiment 1 of the present disclosure;

DETAILED DESCRIPTION OF THE EMBODIMENTS

Figure 2A:
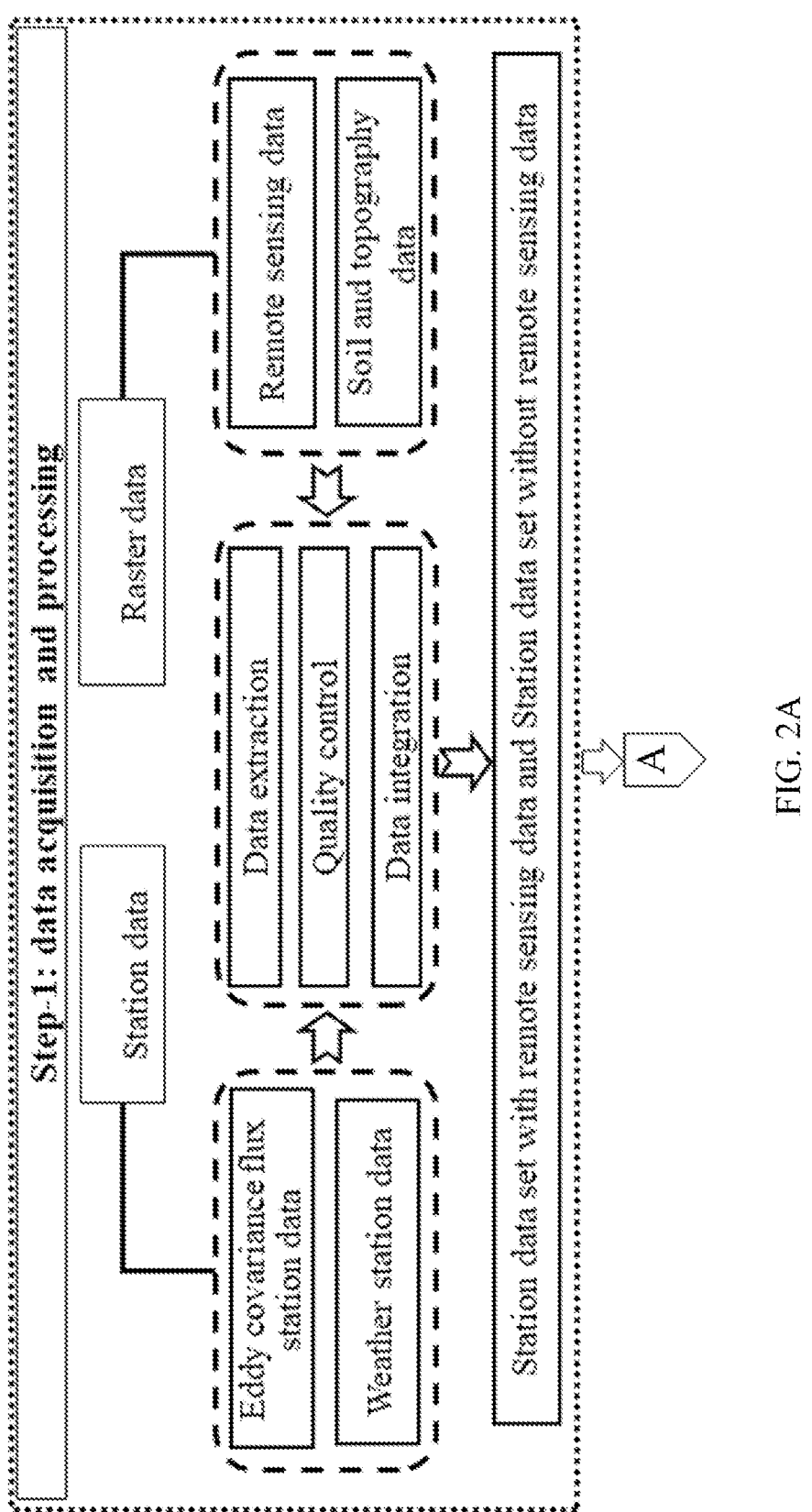
FIGS. 2A-2C together form a functional block diagram of the method provided in Embodiment 1 of the present disclosure.
Figure 2B:
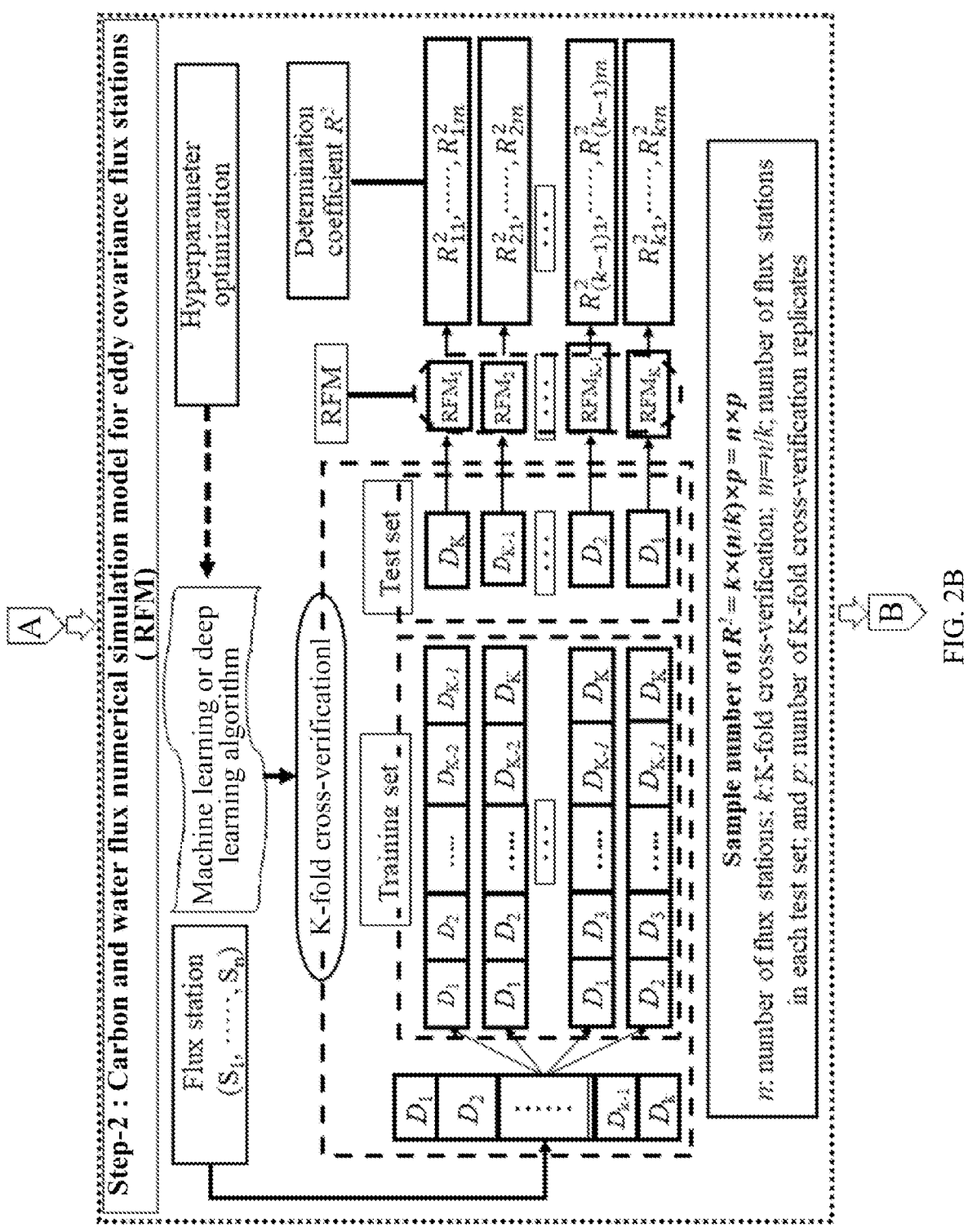
Figure 2C:
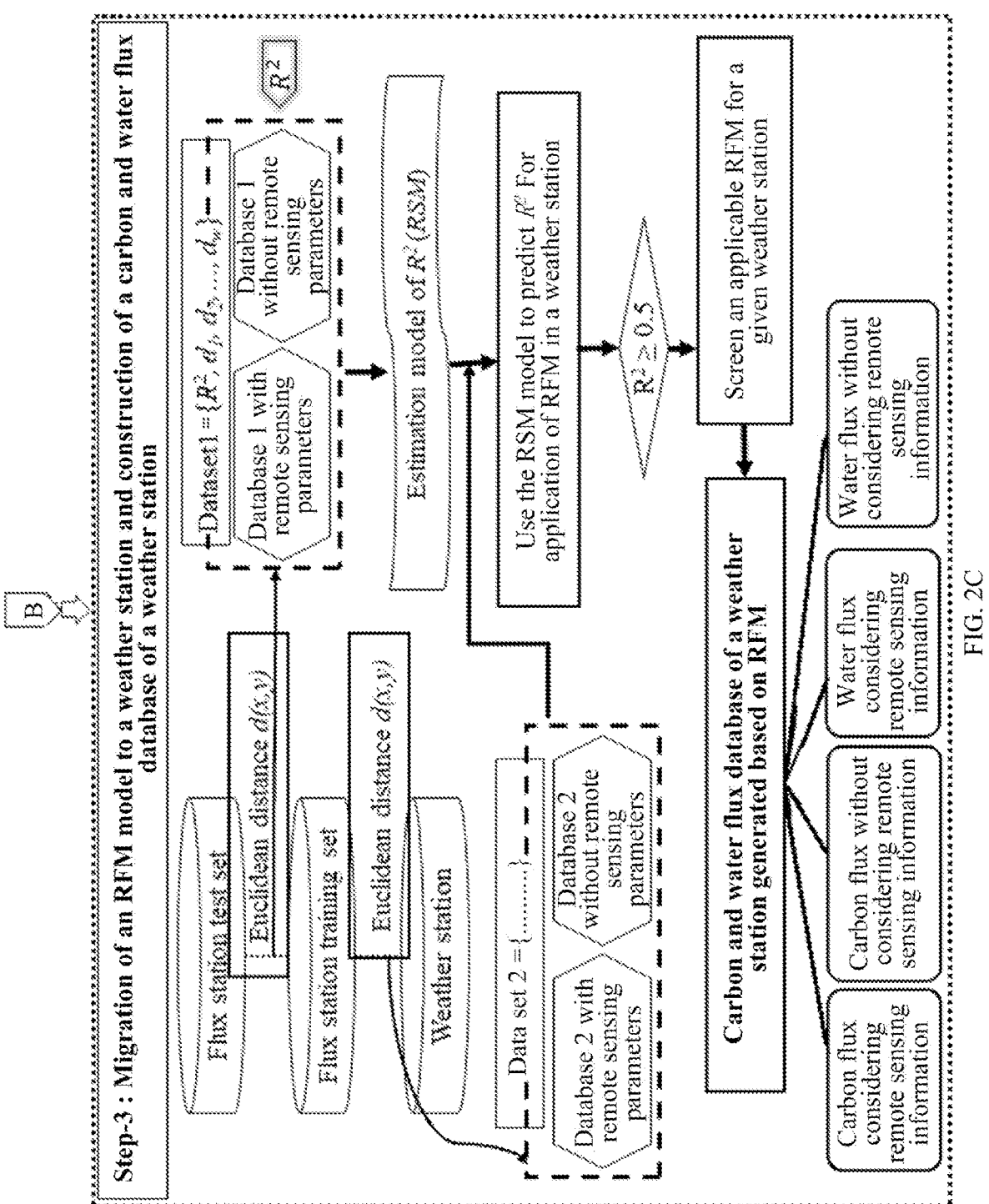

The technical solutions of the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the protection scope of the present disclosure.

An objective of the present disclosure is to provide a method and system for calculating a carbon and water flux of an ecosystem based on a weather station. In the present disclosure, observation data of the weather stations can be used to calculate the carbon and water flux, which improves a data volume of the carbon and water flux and the calculation accuracy.

To make the objectives, features, and advantages of the present disclosure more comprehensible, the present disclosure will be further described in detail below with reference to the accompanying drawings and the specific embodiments.

Embodiment 1

In this embodiment, a method for calculating a carbon and water flux of an ecosystem based on a weather station is provided, and as shown in FIG. 1 and FIGS. 2A-2C, the method includes:

S1: A first observation data set of each eddy covariance flux station in a target area is acquired, where the first observation data set includes carbon and water flux observation data and weather observation data of the eddy covariance flux station and vegetation, soil and topography data of a location of the eddy covariance flux station; or the first observation data set includes the carbon and water flux observation data and the weather observation data of the eddy covariance flux station and the vegetation, soil and topography data and remote sensing data of the location of the eddy covariance flux station.

The target area of this embodiment may be a basin (namely, a river catchment area surrounded by watershed lines), a region, a country, a continent (a general term for a land on Earth and its nearby islands, such as the Eurasia continent), or the entire land (such as the global continent).

Due to the short development time of the remote-sensing technique, if data of eddy covariance flux stations from many years ago need to be acquired, it is likely that remote sensing data cannot be acquired, and the first observation data set of this embodiment may only include carbon and water flux observation data, weather observation data, and vegetation, soil and topography data; and if data of eddy covariance flux stations in recent years need to be acquired, the first observation data set of this embodiment may include carbon and water flux observation data, weather observation data, vegetation, soil and topography data, and remote sensing data. In this embodiment, when the first observation data set includes carbon and water flux observation data, weather observation data, and vegetation, soil and topography data, a carbon and water flux without remote sensing based on the weather station may be calculated through subsequent S2 to S5 based on the first observation data set without remote sensing for each eddy covariance flux station; and when the first observation data set includes carbon and water flux observation data, weather observation data, vegetation, soil and topography data, and remote sensing data, a carbon and water flux with remote sensing based on the weather station may be calculated through subsequent S2 to S5 based on the first observation data set with remote sensing for each eddy covariance flux station.

Specifically, the carbon and water flux observation data of this embodiment include carbon flux observation data and water flux observation data. A carbon flux may be gross primary productivity (GPP) or net ecosystem exchange (NEE), where GPP refers to an amount of photosynthate fixed by organisms through a photosynthetic pathway per unit time or a total amount of organic carbon, and is also known as gross primary production; and NEE refers to a net exchange of a $CO_2$ flux between a land and an atmospheric system. The weather observation data may include an air temperature (which may include daily maximum temperature, daily minimum temperature, daily mean temperature, and diurnal temperature range), a precipitation, a saturated VPD, an air pressure, a DSWR, an atmospheric relative humidity, a wind speed, a wind direction, and a sunshine duration, and may also include other types of weather data. The vegetation, soil and topography data include a soil texture, a land cover type, and a location topography, where the soil texture refers to a combination of mineral particles of different sizes in soil, and may include a percentage of sand, a percentage of silty sand, and a percentage of clay; the land cover type refers to a land cover type that can be identified and defined, and may include a water body, a WET, an artificial earth surface, an arable land, permanent ice and snow, a forest, a GRA, a shrub, a bare land, and a tundra; and the location topography is a general term of ground feature shapes and landforms and specifically refers to various states of rise and fall jointly presented by fixed objects distributed on the earth surface, and five prominent terrains are plain, plateaus, hill, basin, and mountain, which can include a longitude, a latitude, a slope gradient, a slope aspect, and an elevation. The remote sensing data refer to biological and physical parameter data of the earth surface based on remote sensing, and may include a vegetation index, a band spectrum, a surface water index, an LST, and a land surface humidity; and the vegetation index may include a normalized difference vegetation index (NDVI), an enhanced vegetation index (EVI), a leaf area index (LAI), and a fraction of photosynthetically active radiation (FPAR).

It should be noted that the first observation data set of each eddy covariance flux station obtained in this embodiment is matched with the eddy covariance flux station. Preferably, in this embodiment, the first observation data set may also be subjected to quality control and normalization to obtain a processed first observation data set, and the processed first observation data set is used as a new first observation data set to implement S2. The quality control and normalization may be conducted by the existing methods, which will not be repeated here.

In this embodiment, through S1, a geographic information system (GIS) and a remote-sensing technique may be used to produce a first observation data set with remote sensing and a first observation data set without remote sensing for each eddy covariance flux station in the target area, respectively, such as to obtain data for monitoring and evaluating a carbon and water flux of a weather station in the target area.

S2: The eddy covariance flux stations are selectively combined according to a PFT and/or a climate type to obtain a plurality of combinations and a plurality of carbon and water flux data sets respectively corresponding to the plurality of combinations, where the plurality of combinations each include a plurality of training sets and a plurality of test sets and characterize a scenario of a landscape or an ecosystem; and the carbon and water flux data sets each include first observation data sets of all eddy covariance flux stations within a corresponding combination.

In this embodiment, the PFT may include CRO, GRA, DBF, EBF, ENF, MF, SAV, SHR, WET, and a desert. The climate type may include an arid climate, a semi-arid climate, a semi-humid climate, and a humid climate. In this embodiment, a variety of possible scenarios of an ecosystem may be first set according to needs, and then each scenario is combined with a eddy covariance flux station with the same PFT and climate type as the PFT and climate type of the scenario. For example, if a scenario of the ecosystem is a GRA with an arid climate, all eddy covariance flux stations with a PFT of GRA and a climate type of an arid climate are selected and subjected to combination. It should be noted that the PFT and climate type of the eddy covariance flux station refer to a PFT and climate type of a location of the eddy covariance flux station.

A construction method of the carbon and water flux data set may be as follows: random sampling is conducted for first observation data sets of all eddy covariance flux stations in the combination according to a predetermined time scale to obtain the carbon and water flux data set, that is, data in the first observation data sets can be sampled once every 1 predetermined time scale to obtain the carbon and water flux data set, where the predetermined time scale may be 1 day, 8 days, 1 month, 1 quarter, or the like. Predetermined time scales of different carbon and water flux data sets are different or the same.

In this embodiment, there may be hundreds or thousands of combinations, such that, through S2, hundreds or thousands of carbon and water flux data sets of different time scales can be constructed, and hundreds or thousands of scenarios of a landscape or an ecosystem can be characterized. In this embodiment, eddy covariance flux stations distributed in different basins, regions, countries, continents, and global scales are combined according to the PFT and/or climate type to obtain hundreds or thousands of combinations that each characterize a possible scenario of a landscape or an ecosystem; and then hundreds or thousands of carbon and water flux models can be constructed by different machine learning methods based on flux, remote sensing, geographic, and ecological data in each combination.

S3: A carbon and water flux data set corresponding to each of the plurality of combinations is divided by a plurality of division modes to obtain a training set and a test set corresponding to each of the plurality of division modes; training is conducted by a first machine learning algorithm with the training set as an input for each of the plurality of division modes to obtain a carbon and water flux model for predicting a station carbon and water flux of the combination under the division mode; a determination coefficient of the combination under the division mode is calculated with the test set as an input of the carbon and water flux model; an Euclidean distance of each carbon and water flux impact factor between the training set and the test set is calculated to obtain a distance set of the combination under the plurality of division modes; and an evaluation data set is constructed according to determination coefficients and Euclidean distance sets of the plurality of combinations under the plurality of division modes, where the carbon and water flux impact factor refers to data in the first observation data set other than the carbon and water flux observation data.

The division mode in this embodiment may be as follows: A K-fold cross-verification method is used to divide the carbon and water flux data set into K parts, then K-1 parts are randomly selected to constitute a training set, and the remaining 1 part constitutes a test set. In this way, K training sets and corresponding K test sets can be obtained. Of course, in this embodiment, the carbon and water flux data set can also be divided by adjusting proportions of the training set and test set to obtain a plurality of training sets and test sets.

The training by a first machine learning algorithm with the training set as an input to obtain a carbon and water flux model for predicting a station carbon and water flux of the combination under the division mode in S3 may include: with data in the training set other than the carbon and water flux observation data as an input and the carbon and water flux observation data in the training set as a label, training is conducted by the first machine learning algorithm to obtain the carbon and water flux model for predicting a station carbon and water flux of the combination under the division mode.

In this embodiment, when the carbon and water flux observation data include carbon flux observation data and water flux observation data and the carbon and water flux model includes a carbon flux model for predicting a station's carbon flux and a water flux model for predicting a station water flux, the training by a first machine learning algorithm with the training set as an input to obtain a carbon and water flux model for predicting a station carbon and water flux of the combination under the division mode in S3 may include: with data in the training set other than the carbon and water flux observation data as an input and the carbon flux observation data in the training set as a label, training is conducted by the first machine learning algorithm to obtain the carbon flux model for predicting a station's carbon flux of the combination under the division mode; and with data in the training set other than the carbon and water flux observation data as an input and the water flux observation data in the training set as a label, training is conducted by the first machine learning algorithm to obtain the water flux model for predicting a station water flux of the combination under the division mode.

It should be noted that, during the above training process, when the first observation data set includes carbon and water flux observation data, weather observation data, and vegetation, soil and topography data, the weather observation data and vegetation, soil and topography data in the training set are taken as an input; and when the first observation data set includes carbon and water flux observation data, weather observation data, vegetation, soil and topography data, and remote sensing data, the weather observation data, vegetation, soil and topography data, and remote sensing data in the training set are taken as an input. A plurality of carbon and water flux models can be obtained through this training method, and the plurality of carbon and water flux models each include a carbon flux model and a water flux model that are configured to predict a carbon flux and a water flux, respectively. A number of carbon and water flux models is equal to a product of a number of combinations and a number of division modes.

In this embodiment, hyperparameter optimization can be introduced in the training process of carbon and water flux models to improve a training effect for the carbon and water flux models. The first machine learning algorithm can include a Long Short-Term Memory (LSTM) algorithm, a Random Forest (RF) algorithm, a Support Vector Machine (SVM) algorithm, a Back-propagation artificial neural network (BP-ANN) algorithm, a Modelling Animation and Rendering System (MARS) algorithm, an extreme Gradient Boosting (XGB) algorithm, an ensemble algorithm, and a combination thereof, and the ensemble algorithm includes a Boosting algorithm and a Bagging algorithm. A carbon and water flux model can be trained based on each first machine learning algorithm, for example, an RF model (namely, a carbon and water flux model) can be trained by the RF algorithm. The carbon and water flux model of this embodiment may also be a multi-layer perceptron (MLP), including stacking models corresponding to a plurality of first machine learning algorithms and stacking models of the MLP corresponding to one or more first machine learning algorithms.

In this embodiment, with the first machine learning algorithm, hundreds or thousands of carbon and water flux models can be constructed to simulate and calculate multi-time scale carbon and water fluxes of hundreds or thousands of scenarios of an ecosystem. Compared with the biogeochemical model/ecosystem model, the atmospheric carbon dioxide inversion model, the LSP model, and the empirical statistical model, the carbon and water flux model of this embodiment has higher calculation accuracy, because input data of the carbon and water flux model are actual observation data, rather than reanalysis data, and the carbon and water flux model is obtained through training based on actual observation data, rather than integration and coupling of known mechanism processes or empirical cognition.

In this embodiment, a determination coefficient $R^2$ or a relative error may be used to characterize an accuracy of a carbon and water flux model on a test set. In addition, the determination coefficient of the carbon and water flux model also depends on geographic and ecological differences between a carbon and water flux impact factor in a training set of the carbon and water flux model and a corresponding carbon and water flux impact factor in a test set, and thus the determination coefficient can be characterized as a function of an Euclidean distance of each carbon and water flux impact factor; and an evaluation data set including thousands of samples can be constructed from the determination coefficient and the Euclidean distance of each carbon and water flux impact factor. Based on this evaluation data set, a second machine learning algorithm can be used to construct an evaluation model for predicting the determination coefficient $R^2$. In S3, before the plurality of carbon and water flux models constructed are migrated and applied to a weather station, the evaluation model can be used to predict an application determination coefficient for applying each carbon and water flux model to the weather station, such as to determine a carbon and water flux model suitable for the weather station.

In S3, the calculating a determination coefficient of the combination under the division mode with the test set as an input of the carbon and water flux model may include: with data in the test set other than the carbon and water flux observation data as an input, the carbon and water flux model is used to calculate a predicted value of a carbon and water flux; carbon and water flux observation data in the test set are taken as an actual value of the carbon and water flux; and the determination coefficient of the combination under the division mode can be calculated according to the predicted value and actual value of the carbon and water flux, where when the predicted value of the carbon and water flux includes a predicted value of a carbon flux and a predicted value of a water flux and the actual value of the carbon and water flux includes an actual value of the carbon flux and an actual value of the water flux, a determination coefficient can be calculated according to the predicted value and actual value of the carbon flux, a determination coefficient can be calculated according to the predicted value and actual value of the water flux, and an average value of the two determination coefficients can be calculated to obtain the determination coefficient of the combination under the division mode. When the first observation data set includes carbon and water flux observation data, weather observation data, and vegetation, soil and topography data, the weather observation data and vegetation, soil and topography data in the test set are taken as an input; and when the first observation data set includes carbon and water flux observation data, weather observation data, vegetation, soil and topography data, and remote sensing data, the weather observation data, vegetation, soil and topography data, and remote sensing data in the test set are taken as an input. In this way, a determination coefficient of each combination under each division mode can be calculated.

In S3, the calculating an Euclidean distance of each carbon and water flux impact factor between the training set and the test set to obtain a distance set of the combination under the plurality of division modes may include: for each carbon and water flux impact factor, the following equation (1) is used to calculate an Euclidean distance of a carbon and water flux impact factor between the training set and the test set, and Euclidean distances of all carbon and water flux impact factors constitute a distance set under the division modes. If the first observation data set includes carbon and water flux observation data, weather observation data, and vegetation, soil and topography data, the carbon and water flux impact factor includes each type of data in the weather observation data and vegetation, soil and topography data, such as temperature and precipitation; and if the first observation data set includes carbon and water flux observation data, weather observation data, vegetation, soil and topography data, and remote sensing data, the carbon and water flux impact factor includes each type of data in the weather observation data, vegetation, soil and topography data, and remote sensing data. In this way, a distance set of each combination under each division mode can be calculated.

For each carbon and water flux impact factor, a calculation equation of an Euclidean distance is as follows:

$$d(x, y) = \sqrt{(x_1 - y_1)^2 + (x_2 - y_2)^2 \ldots + (x_t - y_t)^2} = \sqrt{\sum_{i=1}^{t}(x_i - y_i)^2} \quad (1)$$

where $d(x, y)$ represents an Euclidean distance; $x_i$ represents a value of a carbon and water flux impact factor of the $i_{th}$ sample in the training set, and $i=1, 2, \ldots, t$; and $y_i$ represents a value of a carbon and water flux impact factor of the $i_{th}$ sample in the test set. Since a number of samples in the training set and a number of samples in the test set are not necessarily the same, in this embodiment, t samples can be randomly selected from each of the training set and the test set to calculate an Euclidean distance, thereby ensuring that the number of samples in the training set and the number of samples in the test set are the same. When the training set and the test set each include many years of data, data on each day of the years can be averaged to obtain average data of each day, such that the training set and the test set each include average data of each day of 365 or 366 days. The average data of each day are taken as a sample to ensure that the number of samples in the training set and the number of samples in the test set are the same. Data in the training set and the test set can also be sorted in an order from smallest to largest or in an order from largest to smallest, the sorted data are divided into t parts, and average data of each part are calculated, such that the training set and the test set each include t parts of average data. The t parts of average data are taken as t samples to ensure that the number of samples in the training set and the number of samples in the test set are the same.

In this embodiment, through S3, a determination coefficient and a distance set of each combination under each division mode can be obtained, and the determination coefficient corresponds to the distance set. Based on this, an evaluation data set may be constructed in this embodiment, and a structure of the evaluation data set is shown in Table 1:

TABLE 1

| ID | $R^2$ | $d_1$ | $d_2$ | ... | $d_{u-1}$ | $d_u$ |
|----|-------|-------|-------|-----|-----------|-------|
| 1 | | | | | | |
| 2 | | | | | | |
| ... | | | | | | |

In Table 1, $R^2$ represents a determination coefficient; and $d_1, d_2, \ldots, d_{u-1}$, and $d_u$ represent Euclidean distances between different carbon and water flux impact factors in the training set of the carbon and water flux model and the corresponding carbon and water flux impact factors in the test set.

S4: Training is conducted by a second machine learning algorithm with the evaluation data set as an input to obtain an evaluation model for predicting a determination coefficient.

The training by a second machine learning algorithm with the evaluation data set as an input to obtain an evaluation model for predicting a determination coefficient in S4 may include: with the distance set in the evaluation data set as an input and the determination coefficient in the evaluation data set as a label, training is conducted by the second machine learning algorithm to obtain the evaluation model for predicting a determination coefficient. The second machine learning algorithm can include a multiple linear regression (MLR) algorithm, an LSTM algorithm, an RF algorithm, an SVM algorithm, a BP-ANN algorithm, an MARS algorithm, an XGB algorithm, and an ensemble algorithm.

For example, an evaluation model $R^2$-M obtained through training by the MLR algorithm is as follows:

$$z = a_0 + a_1 d_1 + a_2 d_2 + \ldots + a_{u-1} d_{u-1} + a_u d_u \qquad (2)$$

where z represents a determination coefficient of the evaluation model; $a_0$, $a_1$, $a_2$, . . . , $a_{u-1}$, and $a_u$ represent regression coefficients; and $d_1$, $d_2$, . . . , $d_{u-1}$, and $d_u$ represent Euclidean distances of different carbon and water flux impact factors.

In order to verify whether a carbon and water flux model suitable for a weather station can be determined based on the evaluation model, in this embodiment, the evaluation model may be first applied to a eddy covariance flux station. Because only carbon and water flux data are additional in a eddy covariance flux station compared with a weather station and other data types are the same, if a carbon and water flux model suitable for a eddy covariance flux station can be determined based on the evaluation model, a carbon and water flux model suitable for a weather station can be determined based on the evaluation model. Specifically, in this embodiment, for each carbon and water flux model, an Euclidean distance of each carbon and water flux impact factor between a training set used for training a carbon and water flux model and a first observation data set of a eddy covariance flux station is calculated, specifically, the test set in equation (1) can be replaced by the first observation data set to obtain a distance set for applying the carbon and water flux model to each eddy covariance flux station; with the distance set as an input, the evaluation model is used to calculate a predicted value of a determination coefficient for applying the carbon and water flux model to each eddy covariance flux station; and with data in the first observation data set of the eddy covariance flux station other than carbon and water flux observation data as an input, the carbon and water flux model is used to calculate a predicted value of a carbon and water flux, the carbon and water flux observation data in the first observation data set are taken as an actual value of the carbon and water flux, and an actual value of a determination coefficient can be calculated according to the predicted value and actual value of the carbon and water flux, such that an actual value of a determination coefficient for applying the carbon and water flux model to each eddy covariance flux station can be obtained. Based on the above method, a predicted value and an actual value of a determination coefficient for applying each carbon and water flux model to each eddy covariance flux station can be obtained. If the predicted value and the actual value of the determination coefficient for applying each carbon and water flux model to each eddy covariance flux station both are greater than or less than a preset threshold, the predicted value and the actual value of the determination coefficient are consistent, and an accuracy rate is calculated according to a consistency situation. The accuracy rate is equal to a consistent quantity divided by a total quantity, and the total quantity is a product of a number of carbon and water flux models and a number of eddy covariance flux stations. It is verified by actual data that the accuracy rate is high, that is, it is believed that a carbon and water flux model suitable for a flux station can be determined based on the evaluation model, indicating that the evaluation model is reliable. Therefore, a carbon and water flux model suitable for a weather station can be determined based on the evaluation model.

S5: The evaluation model is used to determine a carbon and water flux model suitable for a weather station and the carbon and water flux model suitable for the weather station is used to calculate a carbon and water flux of the weather station for each weather station in the target area.

The using the evaluation model to determine a carbon and water flux model suitable for the weather station can include:

(1) A second observation data set of the weather station is acquired, where data of the second observation data set are of the same type as data in the first observation data set other than the carbon and water flux observation data.

If the first observation data set includes carbon and water flux observation data, weather observation data, and vegetation, soil and topography data, the second observation data set includes weather observation data and vegetation, soil and topography data; and if the first observation data set includes carbon and water flux observation data, weather observation data, vegetation, soil and topography data, and remote sensing data, the second observation data set includes weather observation data, vegetation, soil and topography data, and remote sensing data.

(2) For the carbon and water flux model, an Euclidean distance of each carbon and water flux impact factor between a training set used for training the carbon and water flux model and a second observation data set is calculated to obtain an application distance set; and with the application distance set as an input, an evaluation model is used to calculate an application determination coefficient for applying the carbon and water flux model to the weather station, where the application determination coefficient corresponds to the carbon and water flux model.

The test set in equation (1) is replaced by the second observation data set to calculate an Euclidean distance of each carbon and water flux impact factor, such that an application distance set can be obtained.

In this embodiment, a database composed of application determination coefficients for migrating and applying all carbon and water flux models to respective weather stations may also be constructed to evaluate the applicability of migration of the carbon and water flux models to the weather stations, and the database is shown in Table 2 below.

TABLE 2

| ID | $d_1$ | $d_2$ | . . . | $d_{u-1}$ | $d_u$ | $R^2$-M |
|----|-------|-------|-------|-----------|-------|---------|
| 1 | | | | | | |
| 2 | | | | | | |
| . . . | | | | | | |

In Table 2, $d_1$, $d_2$, . . . , $d_{u-1}$, and $d_u$ each represent an Euclidean distance between a carbon and water flux impact factor of the training set of the carbon and water flux model and a carbon and water flux impact factor corresponding to a second observation data set of a weather station; and $R^2$-M represents an application determination coefficient for migrating and applying a carbon and water flux model to a weather station.

(3) The carbon and water flux model suitable for the weather station is determined according to application determination coefficients corresponding to all carbon and water flux models.

Specifically, for each carbon and water flux model, it is determined whether an application determination coefficient corresponding to the carbon and water flux model is greater than or equal to a preset threshold, where if the application determination coefficient corresponding to the carbon and water flux model is greater than or equal to the preset threshold, the carbon and water flux model is suitable for the weather station; if the application determination coefficient corresponding to the carbon and water flux model is less than the preset threshold, the carbon and water flux model is not suitable for the weather station; and all carbon and water flux models suitable for the weather station constitute a candidate set; and a carbon and water flux model with a largest application determination coefficient in the candidate set is selected as the carbon and water flux model suitable for the weather station. If there are no carbon and water flux models in the candidate set, it indicates that the weather station does not have an applicable carbon and water flux model. Through the above method, it can be determined whether a weather station has an applicable carbon and water flux model, and all weather stations each with an applicable carbon and water flux model can be determined.

A determination coefficient determines the applicability of a carbon and water flux model to a eddy covariance flux station. The higher a determination coefficient for applying a carbon and water flux model to a specified eddy covariance flux station, the more similar a training set of the carbon and water flux model is to a first observation data set of the eddy covariance flux station (usually, the determination coefficient is higher than or equal to 0.5). Therefore, the preset threshold in this embodiment can be 0.5; if an application determination coefficient is higher than or equal to 0.5, a carbon and water flux model can be applied to a weather station; and if an application determination coefficient is less than 0.5, it is considered that a carbon and water flux model has a low migration accuracy and cannot be applied to the weather station. Thus, a framework and method system for evaluating the applicability of migration of a carbon and water flux model to a weather station have been established.

Preferably, only a carbon and water flux model corresponding to an application determination coefficient meeting the following standards can be applied to the weather station: low standard: 0.5≤application determination coefficient<0.6; medium standard: 0.6≤application determination coefficient<0.7; and high standard: application determination coefficient≥0.7. Therefore, based on different standards, it can be evaluated whether a constructed carbon and water flux model can be migrated and applied to a weather station or which weather station has an applicable carbon and water flux model. It should be noted that not all constructed carbon and water flux models can be migrated and applied to a weather station, and not all weather stations can have an applicable carbon and water flux model.

After a carbon and water flux model suitable for a weather station is determined, a carbon and water flux (including a carbon flux and a water flux) can be accurately calculated according to actual observation data of the weather station, such that a data set including a carbon and water flux mined based on the weather station can be generated; and data sets of all weather stations in the target area can be used comprehensively to analyze interannual, seasonal, and daily-scale carbon and water dynamic processes and characteristics of different ecosystems and ecosystem combinations in the target area. Compared with the method of acquiring carbon and water flux data through eddy covariance flux stations, the data volume is increased significantly, and the monitoring ability for a carbon and water flux is improved.

In this embodiment, based on a determination coefficient of a carbon and water flux model and an Euclidean distance of a carbon and water flux impact factor thereof, a framework and method system for evaluating the migration of a carbon and water flux model of a flux station to a weather station is established to evaluate whether a weather station in a target area can match a carbon and water flux model that meets accuracy requirements, and the carbon and water flux model that meets accuracy requirements is used to mine a carbon and water flux of the weather station to construct a high-accuracy carbon and water flux data set of the weather station. This technical method can mine the high-accuracy carbon and water flux information of tens of thousands of weather stations worldwide, and can solve the bottleneck problem that there are only hundreds of eddy covariance flux stations worldwide and these eddy covariance flux stations cannot meet the requirements of evaluation of carbon and water fluxes of ecosystems; and the carbon and water fluxes of weather stations generated by this technical method can meet the accuracy requirements of carbon monitoring and carbon accounting of ecosystems, and can provide a technical support for evaluation of peak carbon dioxide emissions and carbon neutrality.

In this embodiment, the method may further include S6-S9. In S6, the actual observation data of weather stations in the target area is acquired. In S7, a carbon and water flux for each weather station is determined using the carbon and water flux model suitable for the weather station based on the actual observation data of the weather station. In S8, a carbon sequestration capacity of an ecosystem in the target area is evaluated based on the determined carbon and water fluxes. In S9, a carbon sequestration scheme for the ecosystem in the target area is designed based on the estimated carbon sequestration capacity of the ecosystem in the target area.

Based on the problem that there is a serious lack of supporting capacity for carbon monitoring and carbon accounting of ecosystems and there is also a lack of new high-accuracy techniques and methods for carbon monitoring and carbon accounting, this embodiment takes into account that, with the development of data mining theories and advanced techniques such as machine learning and remote sensing big data, there is a potential to use limited precious observation data of eddy covariance flux stations to mine carbon flux data of weather stations widely distributed around the world. Therefore, in this embodiment, carbon and water flux models are constructed based on the precious data of eddy covariance flux stations, an applicability evaluation framework for migrating and applying the carbon and water flux models constructed based on the eddy covariance flux stations to weather stations and a technique and method for screening the carbon and water flux models are proposed, and the screened carbon and water flux models, abundant weather stations, and multi-source remote sensing data are used to construct a weather station carbon and water flux data set with quasi-observation properties, which is a major breakthrough in methods and techniques for carbon monitoring and carbon accounting of ecosystems with a lack of carbon flux observation data, can significantly promote the research of global carbon cycling, and can significantly reduce the uncertainty of carbon monitoring and carbon accounting of ecosystems due to insufficient carbon flux observation data in the past.

In the past three years, with the data of the global FluxNet flux station network, European flux network, and American flux network, new techniques and new methods for carbon flux simulation at an observation station scale of "machine learning technique+multiple sampling technique+carbon and water flux observation data+remote sensing big data+ weather station observation data" have been deeply studied, carbon and water flux models of thousands of flux stations have been constructed, 60% of more than 10,000 weather stations worldwide can meet the requirements of the applicable migration of the carbon and water flux models according to evaluation by a model applicability evaluation system, and a high-accuracy daily-scale carbon and water flux data set with quasi-observation properties is constructed for more than 6,000 weather stations worldwide, which provides a solid foundation for the high-accuracy development of carbon accounting models and techniques.

In this embodiment, a technical method for evaluating carbon fluxes and water fluxes of weather stations widely distributed based on rare eddy covariance flux stations unevenly distributed is provided, including: a first observation data set of eddy covariance flux stations in a target area is acquired, hundreds or thousands of carbon and water flux models are constructed based on the limited eddy covariance flux stations in combination with remote sensing big data and machine learning, and an applicability evaluation framework and method system for migrating and applying the constructed carbon and water flux models to weather stations are proposed, including: a determination coefficient $R^2$ of a carbon and water flux model and an Euclidean distance of each carbon and water flux impact factor between a training set and a test set are calculated, an evaluation data set is generated from the $R^2$ and Euclidean distance, and an evaluation model is constructed based on the evaluation data set; and the evaluation model is used to predict $R^2$ of carbon and water flux prediction for applying the constructed carbon and water flux models to all weather stations in the target area, a carbon and water flux model with a prediction accuracy $R^2 \geq 0.5$ is used to simulate multi-time scale carbon and water fluxes of weather stations in the target area, and a carbon and water flux data set of the weather stations that meets the prediction accuracy requirements is constructed, where the carbon and water flux data set has the properties of quasi-observation data. At present, there is no research and development on technical methods for monitoring and evaluating carbon and water fluxes based on weather stations inside and outside China, and the method of the present disclosure has original creativity and will provide a new technical method for high-accuracy evaluation of ecosystems in the monitoring and evaluation of peak carbon dioxide emissions and carbon neutrality.

The application of a cutting-edge technical means to tap the potential of surface observation data mainly from weather stations and the construction of a high-accuracy carbon and water flux data set mainly from weather stations is a potential effective way to solve the bottleneck problem in high-accuracy carbon monitoring and accounting of ecosystems. While fully evaluating the distribution and quantity and the geographic and climatic spatial heterogeneity of global flux stations and weather stations, the theory, method, and technique of carbon flux construction of weather stations are deeply investigated. The global eddy covariance flux stations and the remote sensing and ecological geography big data are used to develop hundreds or thousands of flux station-based carbon and water flux models of an ecosystem based on machine learning technique, multiple sampling technique, remote sensing technique, and GIS, and on this basis, an adaptability evaluation framework and method system for migrating and applying a carbon and water flux model to a weather station are developed; appropriate carbon and water flux models that meet the accuracy requirements and can be migrated to a weather station are selected to construct a carbon and water flux data set of the weather station, and the carbon and water flux data set has quasi-observation properties and can be used to monitor and account for the carbon flux rates, processes, and temporal and spatial change trends of different terrestrial ecosystems; and the constructed carbon and water flux data set of the weather station can also be used to evaluate the accuracy of carbon dynamic simulation based on ecological process model//LSP model/global scale ecosystem, and can also be used for data assimilation on regional/global simulation results to construct a high-accuracy regional/global-scale carbon flux data set. Therefore, this study can deepen the carbon cycling of terrestrial ecosystems and has the potential to significantly improve the accuracy of evaluation of a carbon dynamic process of a regional/global-scale ecosystem, which is of great significance for supporting the formulation of policies in response to climate change and the prediction of future climate change, and provides theoretical and technical supports for the comprehensive evaluation of "peak carbon dioxide emissions and carbon neutrality".

Embodiment 2

This embodiment is different from Embodiment 1 in that a carbon flux and a water flux of an ecosystem are separately calculated; processes of calculating the carbon flux and the water flux are roughly the same as the process of calculating the carbon and water flux in Embodiment 1, and only the carbon and water flux in Embodiment 1 is replaced by the carbon flux and the water flux; and the calculation of the carbon flux is different from the calculation of the water flux only in the data type included in the first observation data set.

If the independence of an impact factor is not considered, a first observation data set used in the calculation of the carbon flux includes carbon flux observation data of eddy covariance flux stations, weather observation data, vegetation, soil and topography data, and remote sensing data, and a first observation data set used in the calculation of the water flux includes water flux observation data of eddy covariance flux stations, weather observation data, vegetation, soil and topography data, and remote sensing data. When the carbon flux and the water flux are calculated, the weather observation data, vegetation, soil and topography data, and remote sensing data include the same data types. The weather observation data include an air temperature (including daily maximum temperature, daily minimum temperature, daily mean temperature, and diurnal temperature range), a precipitation, a saturated VPD, a DSWR, an atmospheric relative humidity, a wind speed, and a sunshine duration (which can also be replaced by a solar radiation); the soil topography data include a percentage of sand, a percentage of silty sand, a percentage of clay, a longitude, a latitude, a slope gradient, a slope aspect, and an elevation; and the remote sensing data include an NDVI, an EVI, an LAI, an FPAR, and a surface water index. Sometimes, it is necessary to consider a time factor, such as a day of a year.

If the independence of an impact factor is considered, a first observation data set used in the calculation of the carbon flux includes carbon flux observation data of eddy covariance flux stations, weather observation data, vegetation, soil and topography data, and remote sensing data, and a first observation data set used in the calculation of the water flux includes water flux observation data of eddy covariance flux stations, weather observation data, vegetation, soil and topography data, and remote sensing data. When the carbon flux and the water flux are calculated, the weather observation data, vegetation, soil and topography data, and remote sensing data include different data types. When the carbon flux is calculated, the weather observation data include an air temperature (including daily mean temperature and diurnal temperature range, or daily maximum temperature, daily minimum temperature, and daily mean temperature), a precipitation, a saturated VPD (which can also be replaced by an atmospheric relative humidity), and a DSWR (which can also be replaced by a sunshine duration or a solar radiation); the vegetation, soil and topography data include a percentage of sand, a percentage of silty sand, a percentage of clay, a longitude, a latitude, a slope gradient, a slope aspect, and an elevation; and the remote sensing data include an NDVI (which can also be replaced by an EVI, an LAI, or an FPAR). When the water flux is calculated, the weather observation data include an air temperature (including daily mean temperature and diurnal temperature range, or daily maximum temperature, daily minimum temperature, and daily mean temperature), a precipitation, a saturated VPD (which can also be replaced by an atmospheric relative humidity), a DSWR (which can also be replaced by a sunshine duration or a solar radiation), and a wind speed; the vegetation, soil and topography data include a percentage of sand, a percentage of silty sand, a percentage of clay, a longitude, a latitude, a slope gradient, a slope aspect, and an elevation; and the remote sensing data include an NDVI (which can also be replaced by an EVI, an LAI, or an FPAR) and a surface water index.

Embodiment 3

Figure 3:
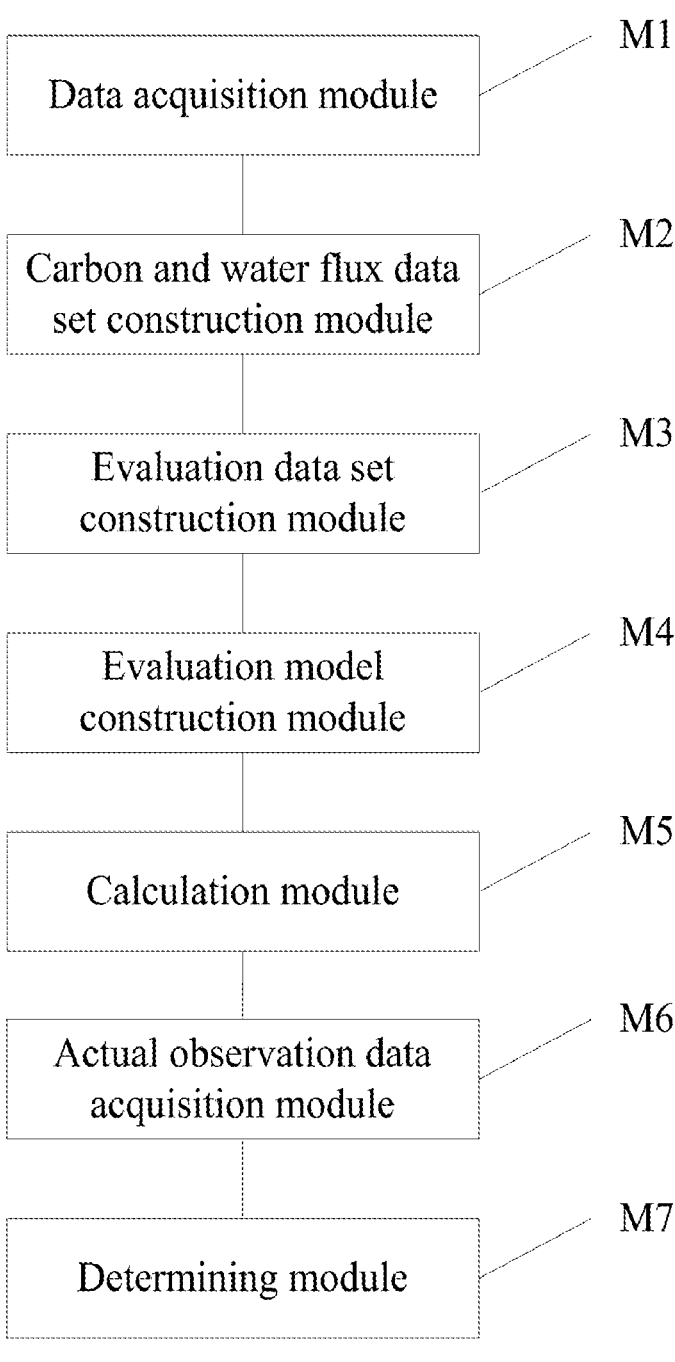
FIG. 3 is a system block diagram of the system provided in Embodiment 3 of the present disclosure.

In this embodiment, a system for calculating a carbon and water flux of an ecosystem based on a weather station is provided, and as shown in FIG. 3, the system includes:

a data acquisition module M1 configured to acquire a first observation data set of each eddy covariance flux station in a target area, where the first observation data set includes carbon and water flux observation data and weather observation data of the eddy covariance flux station and vegetation, soil and topography data of a location of the eddy covariance flux station; or the first observation data set includes the carbon and water flux observation data and the weather observation data of the eddy covariance flux station and the vegetation, soil and topography data and remote sensing data of the location of the eddy covariance flux station;

a carbon and water flux data set construction module M2 configured to selectively combine the eddy covariance flux stations according to a PFT and/or a climate type to obtain a plurality of combinations and a plurality of carbon and water flux data sets respectively corresponding to the plurality of combinations, where the plurality of combinations each include a plurality of training sets and a plurality of test sets and characterize a scenario of a landscape or an ecosystem; and the carbon and water flux data sets each include first observation data sets of all eddy covariance flux stations within a corresponding combination;

an evaluation data set construction module M3 configured to divide a carbon and water flux data set corresponding to each of the plurality of combinations by a plurality of division modes to obtain a training set and a test set corresponding to each of the plurality of division modes; train by a first machine learning algorithm with the training set as an input for each of the plurality of division modes to obtain a carbon and water flux model for predicting a station carbon and water flux of the combination under the division mode; calculate a determination coefficient of the combination under the division mode with the test set as an input of the carbon and water flux model; calculate an Euclidean distance of each carbon and water flux impact factor between the training set and the test set to obtain a distance set of the combination under the plurality of division modes; and construct an evaluation data set according to determination coefficients and Euclidean distance sets of the plurality of combinations under the plurality of division modes, where the carbon and water flux impact factor refers to data in the first observation data set other than the carbon and water flux observation data;

an evaluation model construction module M4 configured to train by a second machine learning algorithm with the evaluation data set as an input to obtain an evaluation model for predicting a determination coefficient; and a calculation module M5 configured to determine, for each weather station in the target area, a carbon and water flux model suitable for the weather station by using the evaluation model;

an actual observation data acquisition module M6 configured to acquire actual observation data of weather stations in the target area and a determining module M7 configured to determine a carbon and water flux for each weather using the carbon and water flux model suitable for the weather station based on the actual observation data of the weather station, to evaluate a carbon sequestration capacity of an ecosystem in the target area and design a carbon sequestration scheme for the ecosystem in the target area.

The description of each embodiment in this specification focuses on a difference of the embodiment from other embodiments. The same or similar parts of these embodiments may refer to each other. Since the system disclosed in an embodiment corresponds to the method disclosed in another embodiment, the description is relatively simple, and reference can be made to the method description.

Specific embodiments are used herein to explain the principles and implementations of the present disclosure. The description of the embodiments is merely intended to help understand the method of the present disclosure and its core ideas. In addition, those of ordinary skill in the art can make various modifications to the specific implementations and application scope in accordance with the teachings of the present disclosure. In conclusion, the content of the present specification shall not be construed as limitations to the present disclosure.

What is claimed is:

1. A method for calculating a carbon and water flux of an ecosystem based on a multiple weather stations, comprising:

acquiring a first observation data set of each of multiple eddy covariance flux stations in a target area, wherein the first observation data set comprises carbon and water flux observation data and weather observation data of each eddy covariance flux station and vegetation, soil and topography data of a location of each eddy covariance flux station; or the first observation data set comprises carbon and water flux observation data and the weather observation data of each eddy covariance flux station and vegetation, soil and topography data and remote sensing data of a location of each eddy covariance flux station;

selectively combining selected ones of the first observation data sets of the multiple eddy covariance flux stations according to at least one of a plant function type (PFT) and a climate type to obtain a plurality of combinations and a plurality of carbon and water flux data sets respectively corresponding to the plurality of combinations, wherein the plurality of combinations each include a plurality of training sets and a plurality of test sets and characterize a scenario of a landscape or an ecosystem; and the carbon and water flux data sets each comprise the first observation data sets of all eddy covariance flux stations within a corresponding combination;

dividing a carbon and water flux data set corresponding to each of the plurality of combinations by a plurality of division modes to obtain a training set and a test set corresponding to each of the plurality of division modes; training by a first machine learning algorithm with the training set as an input for each of the plurality of division modes to obtain a carbon and water flux model for predicting a station carbon and water flux of the combination under the division mode; calculating a determination coefficient of the combination under the division mode with the test set as an input of the carbon and water flux model; calculating an Euclidean distance of each carbon and water flux impact factor between the training set and the test set to obtain a distance set of the combination under the plurality of division modes; and constructing an evaluation data set according to determination coefficients and Euclidean distance sets of the plurality of combinations under the plurality of division modes, wherein the carbon and water flux impact factor refers to data in the first observation data set other than the carbon and water flux observation data;

training by a second machine learning algorithm with the evaluation data set as an input to obtain an evaluation model for predicting a determination coefficient;

determining, for the multiple weather stations in the target area, a carbon and water flux model suitable for each of the multiple weather stations by using the evaluation model;

acquiring actual observation data of each weather station;

determining a carbon and water flux for the weather station using the carbon and water flux model suitable for the weather station based on the actual observation data of the weather station;

monitoring, based on the determined carbon and water flux, a carbon flux rate and a temporal and spatial change trend of an ecosystem in the target area to evaluate a carbon sequestration capacity of the ecosystem in the target area; and designing a carbon sequestration for the ecosystem in the target area based on the estimated carbon sequestration capacity of the ecosystem in the target area to optimize the ecosystem in the target area.

2. The method according to claim 1, wherein the weather observation data comprise an air temperature, a precipitation, a saturated vapor pressure deficit (VPD), an air pressure, a downward short-wave radiation (DSWR), an atmospheric relative humidity, a wind speed, a wind direction, and a sunshine duration; the vegetation, soil and topography data comprise a soil texture, a land cover type, and a location topography; and the remote sensing data comprise a vegetation index, a band spectrum, a surface water index, a land surface temperature (LST), and a land surface humidity.

3. The method according to claim 1, wherein the PFT comprises a cropland (CRO), a grassland (GRA), a deciduous broadleaf forest (DBF), an evergreen broadleaf forest (EBF), an evergreen needleleaf forest (ENF), a mixed forest (MF), a savannah (SAV), a shrubland (SHR), a wetland (WET), and a desert; and the climate type comprises an arid climate, a semi-arid climate, a semi-humid climate, and a humid climate.

4. The method according to claim 1, wherein a construction method of the carbon and water flux data set comprises: randomly sampling for the first observation data sets of all eddy covariance flux stations in the combination according to a predetermined time scale to obtain the carbon and water flux data set.

5. The method according to claim 1, wherein when the carbon and water flux observation data comprise carbon flux observation data and water flux observation data and the carbon and water flux model comprises a carbon flux model for predicting a station's carbon flux and a water flux model for predicting a station water flux, the training by a first machine learning algorithm with the training set as an input to obtain a carbon and water flux model for predicting a station carbon and water flux of the combination under the division mode specifically comprises:

with data in the training set other than the carbon and water flux observation data as an input and the carbon flux observation data in the training set as a label, training by the first machine learning algorithm to obtain the carbon flux model for predicting a station's carbon flux of the combination under the division mode; and with data in the training set other than the carbon and water flux observation data as an input and the water flux observation data in the training set as a label, training by the first machine learning algorithm to obtain the water flux model for predicting a station water flux of the combination under the division mode.

6. The method according to claim 5, wherein when the carbon flux model is trained, the weather observation data comprise an air temperature, a precipitation, a saturated VPD, and a DSWR, the vegetation, soil and topography data comprise a soil texture and a location topography, and the remote sensing data comprise a vegetation index; and when the water flux model is trained, the weather observation data comprise an air temperature, a precipitation, a saturated VPD, a DSWR, and a wind speed, the vegetation, soil and topography data comprise a soil texture and a location topography, and the remote sensing data comprise a vegetation index and a surface water index.

7. The method according to claim 1, wherein the using the evaluation model to determine a carbon and water flux model suitable for each weather station comprises:

acquiring a second observation data set of each weather station, wherein data of the second observation data set are of the same type as data in the first observation data set other than the carbon and water flux observation data;

for the carbon and water flux model, calculating an Euclidean distance of each carbon and water flux impact factor between a training set used for training the carbon and water flux model and the second observation data set to obtain an application distance set; and with the application distance set as an input, using the evaluation model to calculate an application determination coefficient for applying the carbon and water flux model to the weather station, wherein the application determination coefficient corresponds to the carbon and water flux model; and determining the carbon and water flux model suitable for the weather station according to application determination coefficients corresponding to all carbon and water flux models.

8. The method according to claim 7, wherein the determining the carbon and water flux model suitable for the weather station according to application determination coefficients corresponding to all carbon and water flux models comprises:

for each carbon and water flux model, determining whether an application determination coefficient corresponding to the carbon and water flux model is greater than or equal to a preset threshold, wherein if the application determination coefficient corresponding to the carbon and water flux model is greater than or equal to the preset threshold, the carbon and water flux model is suitable for the weather station; if the application determination coefficient corresponding to the carbon and water flux model is less than the preset threshold, the carbon and water flux model is not suitable for the weather station; and all carbon and water flux models suitable for the weather station constitute a candidate set; and selecting a carbon and water flux model with a largest application determination coefficient in the candidate set as the carbon and water flux model suitable for the weather station.

9. The method according to claim 8, wherein the preset threshold is greater than or equal to 0.5.

10. The method according to claim 1, wherein the target area is selected from one or more of a basin, a region, a country, a continent, and an entire land.

11. A system for calculating a carbon and water flux of an ecosystem based on multiple a weather stations, comprising:

at least one processor and a memory for storing instructions wherein, when the instructions are executed by the at least one processor, the at least one processor is configured to:

acquire a first observation data set of each of multiple eddy covariance flux stations in a target area, wherein the first observation data set comprises carbon and water flux observation data and weather observation data of each eddy covariance flux station and vegetation, soil and topography data of a location of each eddy covariance flux station; or the first observation data set comprises the carbon and water flux observation data and weather observation data of each eddy covariance flux station and vegetation, soil and topography data and remote sensing data of a location of each eddy covariance flux station;

selectively combine selected ones of the first observation data sets of the multiple eddy covariance flux stations according to at least one of a PFT and a climate type to obtain a plurality of combinations and a plurality of carbon and water flux data sets respectively corresponding to the plurality of combinations, wherein the plurality of combinations each comprise a plurality of training sets and a plurality of test sets and characterize a scenario of a landscape or an ecosystem; and the carbon and water flux data sets each comprise first observation data sets of all eddy covariance flux stations within a corresponding combination;

divide a carbon and water flux data set corresponding to each of the plurality of combinations by a plurality of division modes to obtain a training set and a test set corresponding to each of the plurality of division modes; train by a first machine learning algorithm with the training set as an input for each of the plurality of division modes to obtain a carbon and water flux model for predicting a station carbon and water flux of the combination under the division mode; calculate a determination coefficient of the combination under the division mode with the test set as an input of the carbon and water flux model; calculate an Euclidean distance of each carbon and water flux impact factor between the training set and the test set to obtain a distance set of the combination under the plurality of division modes; and construct an evaluation data set according to determination coefficients and Euclidean distance sets of the plurality of combinations under the plurality of division modes, wherein the carbon and water flux impact factor refers to data in the first observation data set other than the carbon and water flux observation data;

train by a second machine learning algorithm with the evaluation data set as an input to obtain an evaluation model for predicting a determination coefficient;

determine, for the multiple weather stations in the target area, a carbon and water flux model suitable for each of the multiple weather stations by using the evaluation model;

acquire actual observation data of each weather station; and determine a carbon and water flux for the weather station using the carbon and water flux model suitable for the weather station based on the actual observation data of the weather station, monitor a carbon flux rate and a temporal and spatial change trend of an ecosystem in the target area based on the determined carbon and water flux to evaluate a carbon sequestration capacity of the ecosystem in the target area and design a carbon sequestration for the ecosystem in the target area to optimize the ecosystem in the target area.

* * * * *